(12) United States Patent
Wang et al.

(10) Patent No.: US 9,768,065 B1
(45) Date of Patent: Sep. 19, 2017

(54) INTERCONNECT STRUCTURES WITH VARIABLE DOPANT LEVELS

(71) Applicant: GLOBALFOUNDRIES INC., Grand Cayman (KY)

(72) Inventors: Ping-Chuan Wang, Hopewell Junction, NY (US); Erdem Kaltalioglu, Newburgh, NY (US); Ronald G. Filippi, Wappingers Falls, NY (US); Cathryn J. Christiansen, Essex Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 5 days.

(21) Appl. No.: 15/203,084

(22) Filed: Jul. 6, 2016

(51) Int. Cl.
| | |
|---|---|
| *H01L 21/00* | (2006.01) |
| *H01L 21/768* | (2006.01) |
| *H01L 23/522* | (2006.01) |
| *H01L 23/532* | (2006.01) |

(52) U.S. Cl.
CPC .. *H01L 21/76886* (2013.01); *H01L 21/76802* (2013.01); *H01L 21/76873* (2013.01); *H01L 21/76879* (2013.01); *H01L 23/5226* (2013.01); *H01L 23/53233* (2013.01)

(58) Field of Classification Search
CPC .................................................. H01L 21/76886
See application file for complete search history.

(56) References Cited

U.S. PATENT DOCUMENTS

| | | | |
|---|---|---|---|
| 8,492,897 B2 | 7/2013 | Cabral, Jr. et al. | |
| 8,772,942 B2 | 7/2014 | Edelstein et al. | |
| 2010/0065967 A1 | 3/2010 | Koike et al. | |
| 2010/0200991 A1 | 8/2010 | Akolkar et al. | |
| 2012/0141667 A1 | 6/2012 | Kim et al. | |
| 2013/0234284 A1* | 9/2013 | Bonilla | H01L 23/5256 257/529 |

\* cited by examiner

*Primary Examiner* — William Harriston
(74) *Attorney, Agent, or Firm* — Scully Scott Murphy and Presser; Frank Digiglio (57) ABSTRACT

Interconnect structures and related methods of manufacture improve device reliability and performance by selectively incorporating dopants into conductive lines. Multiple seed layer deposition steps or variable trench bottom areas are used to locally control the dopant concentration within the interconnect structures at the same wiring level, which provides a robust integration approach for metallizing interconnects in future-generation technology nodes.

13 Claims, 5 Drawing Sheets

INTERCONNECT STRUCTURES WITH VARIABLE DOPANT LEVELS

BACKGROUND

The present application relates generally to interconnect structures for microelectronic devices, and more particularly to structures and methods for improving device reliability and performance by the selective incorporation of dopants into conductive lines.

Total on-chip interconnect lengths have been increasing exponentially with technology scaling. As a result, interconnect-driven design is an evolving trend in state-of-the-art integrated circuits. Copper-based interconnect technology is expected to meet some of the challenges of technology scaling. However, copper interconnects still pose reliability concerns due to electromigration-induced failure over time.

The alloying of copper (Cu) interconnects with dopants such as manganese (Mn) has been shown to improve electromigration reliability. However, the addition of manganese significantly increases interconnect resistance, which negatively impacts performance.

Thus, there is an ongoing need for methods and structures to improve electromigration reliability without adversely affecting device performance.

SUMMARY

In accordance with embodiments of the present application, an integrated circuit includes a first interconnect and a second interconnect at the same wiring level. The first interconnect includes a first bulk metal layer having a first dopant concentration, and the second interconnect includes a second bulk metal layer having a second dopant concentration.

A method of forming an integrated circuit includes forming a first interconnect and a second interconnect within respective trenches at the same wiring level. A first dopant concentration is provided within the first interconnect, and a second dopant concentration different from the first dopant concentration is provided within the second interconnect.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Reference will now be made in greater detail to various embodiments of the subject matter of the present application, some embodiments of which are illustrated in the accompanying drawings. The same reference numerals will be used throughout the drawings to refer to the same or similar parts.

The term electromigration describes the solid-state diffusion and net displacement of metal atoms in a conductor under the influence of an applied electrical current. Over time, metal atom migration can result in the formation of voids and the concomitant increase in electric resistance of the interconnect, which negatively affects the reliability of the device. The time it takes to form voids that cause failure in the interconnect is called the electromigration lifetime.

For copper interconnects used in microelectronics, the electromigration lifetime is generally determined by mass transport at the interface between the copper and a dielectric capping layer. Accordingly, many schemes to improve electromigration resistance aim to improve the adhesion between the dielectric capping layer and the copper.

One scheme uses an alloyed seed layer to introduce a dopant (impurity) into the copper line. In the alloyed seed layer approach, after electroplating copper over the seed layer, the impurity within the seed layer segregates to the copper/dielectric cap interface to form an impurity alloy layer. The greater the impurity content, the greater the electromigration resistance (i.e., longer electromigration lifetime), which is particularly beneficial for power interconnects. Without wishing to be bound by theory, the addition of impurities such as Mn causes a reduction in Cu diffusivity at the Cu/dielectric cap interface and may also beneficially mitigate Cu grain boundary diffusion.

However, impurities such as Mn increase the electrical resistance of the copper. As interconnect line widths decrease, greater impurity content is required to increase electromigration lifetime, thus further exacerbating the problem of increased electrical resistance. A low electrical resistance (i.e., low dopant concentration) is desired for high-speed performance of signal interconnects.

Accordingly, disclosed herein are methods and structures for improving electromigration reliability through doping while mitigating the attendant increase in doping-induced electrical resistance. In various embodiments, interconnect structures within the same wiring level of a chip or integrated circuit have different dopant concentrations within the structures, i.e., different segregation levels. Thus, first interconnect structures corresponding, for example, to a signal interconnect can have a relatively low dopant concentration while second interconnect structures corresponding, for example, to a power interconnect can have a relatively high dopant concentration.

As used herein, the "same wiring level" and variants thereof refers to wiring structures having at least one of a co-planar bottom surface and a co-planar top surface. In various embodiments, wiring structures at the same wiring level have both a co-planar bottom surface and a co-planar top surface.

Figure 1A:
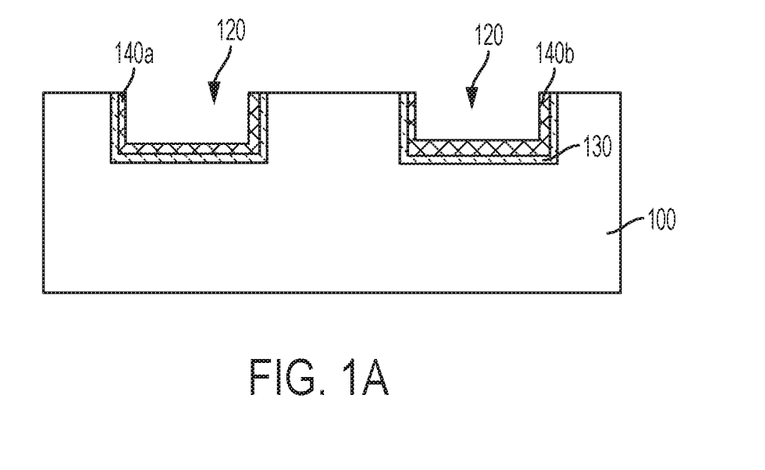
FIGS. 1A and 1B are cross-sectional schematic views of interconnect architectures having a different dopant content at the same wiring level.
Figure 1B:
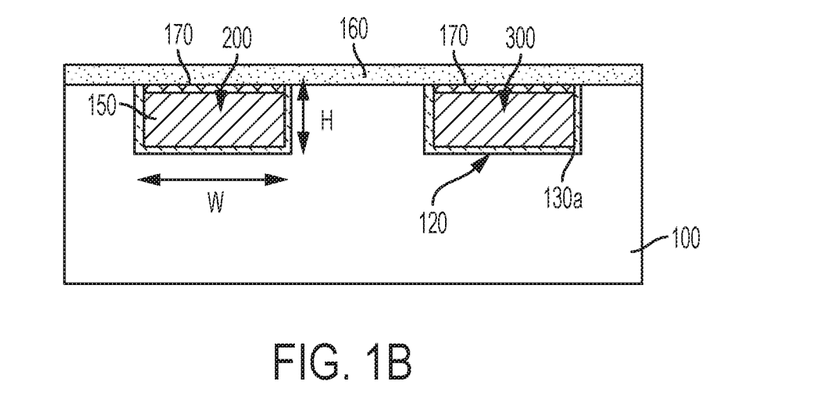

Referring to FIGS. 1A and 1B, shown are cross-sectional schematic views of a dielectric layer 100 patterned to include trenches 120 having formed therein first and second interconnect structures 200, 300. Dielectric layer 100 may comprise silicon oxide, for example. The interconnect structures 200, 300 may be defined using a damascene or dual damascene technique and, in the illustrated embodiment, are located at the same wiring level.

Conventional photolithography and etching can be used to form the trenches 120 in the dielectric layer 100. By way of example, a photoresist layer (not shown) can be applied over the dielectric layer 100, and can be lithographically patterned to form openings corresponding to areas of openings to be subsequently formed in the dielectric layer 100. As known to those skilled in the art, the pattern in the photoresist layer can be transferred into the dielectric layer using an isotropic or anisotropic etch.

As shown in FIG. 1A, once the trenches are formed, a barrier layer (or liner) 130 is deposited over the dielectric layer 100 and into the trenches 120. In the illustrated embodiment, the barrier layer 130 is provided on both the sidewalls and the bottom surfaces of the trenches. In alternate embodiments, the barrier layer may be omitted, provided only on the trench sidewalls, or only on the trench bottom surface. The barrier layer 130 may include tantalum, tantalum nitride, or a combination thereof. For instance, the barrier layer may include a Ta layer and a TaN layer. Another suitable barrier layer material is cobalt. The barrier layer 130 may operate to prevent copper, which is a mid-bandgap impurity in silicon and silicon oxide, from diffusing into the dielectric layer 100.

Seed layers 140a, 140b are then blanket deposited over the barrier layer 130 to cover the inner (i.e., horizontal and vertical) surfaces of the trenches 120. In various embodiments, seed layers 140a, 140b are formed directly over the barrier layer 130 and typically include elemental copper or a copper alloy containing a dopant (impurity) species. An example dopant is manganese (Mn).

The concentration of the dopant within the seed layers may range from 0 to 2 atomic percent, e.g., 0, 0.05, 0.1, 0.2, 0.5, 1 or 2 atomic percent, including ranges between any of the foregoing values. In addition to providing a dopant source as discussed in further detail below, the seed layer promotes adhesion and promotes good electrical contact between copper interconnect lines.

The seed layers 140a, 140b are typically deposited using either chemical vapor deposition (CVD) or physical vapor deposition (PVD) to a thickness of 10 to 300 nm, e.g., 10, 20, 50, 100, 200 or 300 nm, including ranges between any of the foregoing values. Chemical vapor deposition is a conformal process and can be used to line the trenches while minimizing pinch-off and void formation. A physical vapor deposition process, on the other hand, can be used to form a high purity layer that is free from unwanted impurities such as oxygen, carbon, or nitrogen. In various embodiments, the content of oxygen, carbon and nitrogen within the seed layer are each less than 1 atomic percent, e.g., less than 1, 0.5, 0.2, 0.1, 0.05, 0.02 or 0.01 atomic percent, including ranges between any of the foregoing values.

Portions of the barrier layer 130 and seed layer 120 are removed from above the horizontal plane of the top surface of the dielectric layer 100 using, for example, chemical mechanical polishing (CMP) to form the intermediate structure illustrated in FIG. 1A.

Referring to FIG. 1B, the process continues whereby a bulk copper layer 150 is electroplated over the seed layers to fill trenches 120 using methods known to those skilled in the art. A planarized surface is then formed using, for example, chemical mechanical polishing, whereby excess bulk copper is removed such that the top surface of each bulk copper layer 150 is coplanar with the top surface of the dielectric layer 100.

A dielectric capping layer 160 is formed on the planarized surface. The dielectric capping layer may comprise a nitride compound such as nitrogen-doped silicon carbide (SiCN). Other suitable dielectric capping layer compositions include $Si_3N_4$, $SiO_2$, SiC, and hydrogen-doped silicon carbide. In various embodiments, the dielectric capping layer has a thermal expansion coefficient that is greater than that of the bulk copper.

In various embodiments, the capping layer 160 is formed by plasma enhanced chemical vapor deposition (PECVD) at a temperature of 300° C. to 550° C. During formation of the dielectric capping layer and/or during a post-deposition anneal, crystalline grains within the copper seed layer and/or within the bulk electroplated copper may grow, and solid state diffusion may result in merger of the seed layer and the electroplated copper layer into a single metal alloy layer 130a. In various embodiments, the single metal layer is an alloy that includes copper and manganese.

The elevated deposition (or anneal) temperature also drives the impurities from the seed layer 130, metal alloy layer 130a, and the electroplated copper layer 150 to the interface with the dielectric capping layer 160. In various embodiments, the copper of the bulk copper layer 150 recrystallizes into a single grain structure of substantially pure copper, as the impurities from the seed layer segregates out of the bulk copper layer to the top surface thereof. The single grain structure of the recrystallized bulk copper layer 150 minimizes the electrical resistance of the interconnect structure such that the performance of an integrated circuit comprising the interconnect structure is improved. At the interface, the impurities react with the capping layer 160 and are incorporated into metal alloy layer 170. In various embodiments, the thickness of the metal alloy layer 170 can range from 1 nm to 10 nm, e.g., 1, 2, 5, or 10 nm, including ranges between any of the foregoing values. In various embodiments, the thickness of the metal alloy layer 170 is proportional to the amount of dopant that reacts with the capping layer 160.

The metal alloy layer 170 can suppress diffusion of copper atoms at the interface and thereby minimize void formation within the metal line providing an interconnect structure with enhanced performance and reliability. According to various embodiments, the dopant content within a metal alloy layer 170 is proportional to the dopant content within a corresponding seed layer 140a, 140b.

In various embodiments, the same dopant concentration is provided in first and second seed layers 140a, 140b. In further embodiments, the dopant concentration provided in first seed layer 140a is different than the dopant concentration provided in second seed layer 140b. As discussed further below, according to both embodiments, interconnect structures 200, 300 can be formed where the concentration of a dopant incorporated into the conductive (copper) lines, e.g., into metal alloy layers 170, varies within the same wiring level. The variability in dopant concentration may be inter-line or intra-line variability. As used herein, variability within the dopant profile means that the dopant concentration within a first region of an interconnect structure varies by at least 5% from the dopant concentration within a second region of an interconnect structure, e.g., 5, 10, 20, 50, 100 or 200%, including ranges between any of the foregoing values.

Dopant atoms may be incorporated into an interconnect structure by initially forming a doped seed layer and, after formation of the interconnect (bulk) metal layer over the seed layer, heating the interconnect structure to diffuse the dopant atoms into the bulk metal. The heating may be performed during formation of a capping layer.

The concentration of dopant atoms within different regions of the interconnect structure at the same wiring level can be established by controlling the concentration of dopant atoms within different regions of a seed layer. According to various embodiments, multiple seed layer deposition steps are used to provide a first seed layer 140a having a first dopant content and a second seed layer 140b having a second dopant content different from the first dopant content.

Figure 2A:
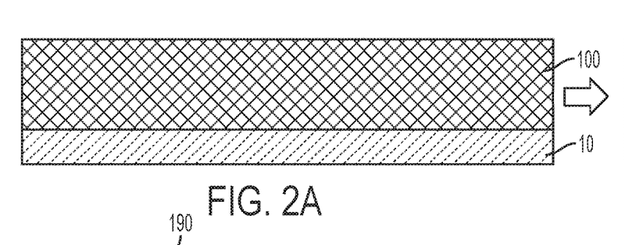
FIGS. 2A-2F are cross-sectional views illustrating the formation of an interconnect architecture having different dopant concentrations within different conductive lines at the same wiring level through the formation of seed layers having different dopant concentrations.

An example method of forming a locally-doped interconnect structure is illustrated with reference to FIGS. 2A-2F. A dielectric layer 100 is disposed over a semiconductor substrate 10 (FIG. 2A). By way of example, the semiconductor substrate 10 may comprise a semiconductor-on-insulator (SOI) substrate or a bulk semiconductor substrate, and may include any semiconductor material such as Si, SiGe, Ge, GaAs, as well as other III/V or II/VI compound semiconductors. One or more layers within the semiconductor substrate may be a single crystal (monocrystalline) layer having, for example, a dislocation density of <$10^6$/cm$^2$.

Figure 2B:
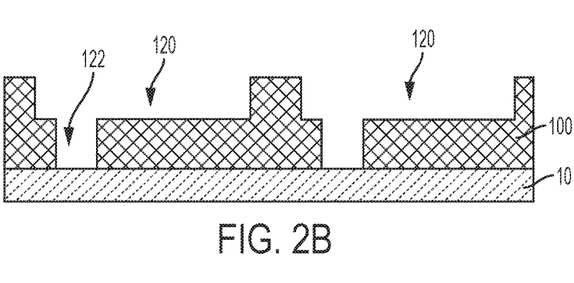

As shown in FIG. 2B, trenches 120 are etched into dielectric layer 100 by conventional patterning techniques. For instance, trenches 120 can be etched using reactive ion etching (RIE). Trenches 120 may include contact apertures 122 that extend through the dielectric layer 100 to a top surface of the semiconductor substrate 10.

Figure 2C:
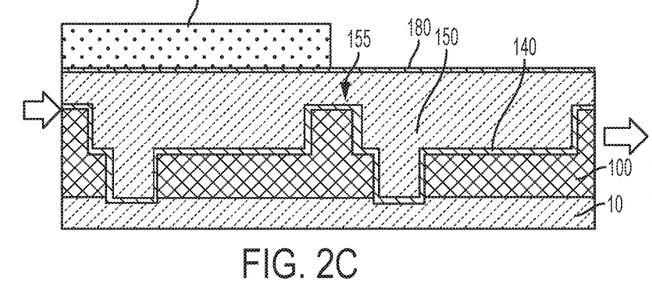

Then, as illustrated in the intermediate structure of FIG. 2C, a bulk copper layer 150 is electroplated over a doped and conformal seed layer 140. The overburden (excess) portion 155 of the copper layer 150 extends above a top surface of the dielectric layer 100. An optional hard mask 180 (e.g., Ta or TaN) and a photoresist layer 190 are formed over the bulk copper layer 150. The photoresist layer 190 is patterned to cover a first portion of the deposited structure. The photoresist layer 190 may comprise a 248 nm resist, a 193 nm resist, a 157 nm resists, or an EUV (extreme ultraviolet) resist.

Figure 2D:
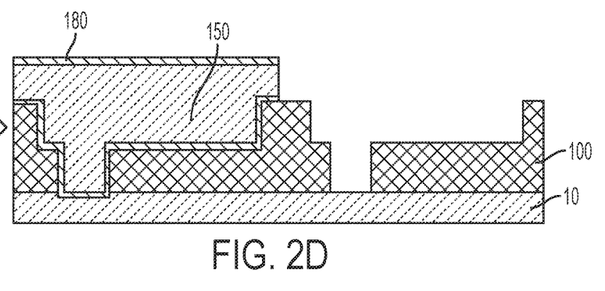
Figure 2E:
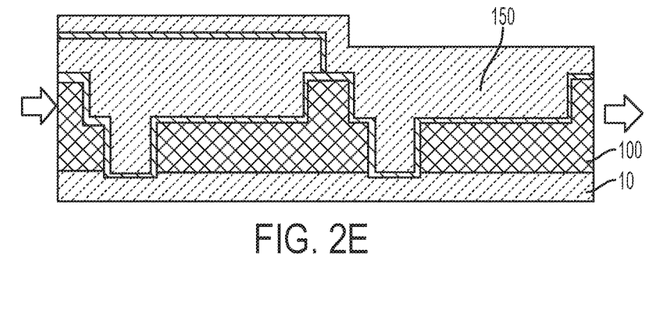

As seen in FIG. 2D, an etching step is used to remove the hard mask 180, bulk copper layer 150, and seed layer 140 that are unprotected by the photoresist layer, exposing a portion of dielectric layer 100. The photoresist layer 190 is removed. Then, referring to FIG. 2E, a second doped seed layer is deposited over the exposed portion of the dielectric layer as well as the incumbent bulk copper layer, followed by a second electroplating step.

Figure 2F:
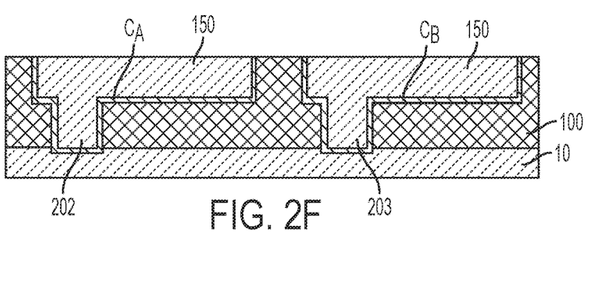

Referring to FIG. 2F, using chemical mechanical polishing (CMP), progressive oxidation and removal of oxidized copper can be used to incrementally remove top surfaces of the overburden 155 forming adjacent, isolated bulk copper layers 150 that are co-planar with a top surface of the dielectric layer 100. In various embodiments, the dopant concentration within the first seed layer ($C_A$) varies by at least 5% from the dopant concentration within the second seed layer ($C_B$). In such embodiments, deposition of a capping layer (not shown) and the associated dopant segregation forms adjacent interconnect structures at the same wiring level having different dopant concentrations.

With the foregoing approach, local variation in the dopant content within the interconnect structures is created using multiple patterning and deposition steps. A first seed layer having a first dopant concentration is formed within a first region of the interconnect architecture, and a second seed layer having a second dopant concentration different from the first dopant concentration is then formed within a second region of the interconnect architecture. Thus, the first seed layer is formed globally, selectively removed, and the interconnect architecture is then re-seeding locally. It will be appreciated, however, that the first and second seed layers may each be formed locally (i.e., within respective first and second regions). In related embodiments, the respective thicknesses of the first seed layer and the second seed layer may be equal or unequal.

According to further embodiments, in lieu of depositing separate seed layers having different dopant concentrations, a single seed layer can be deposited in a single deposition step. The dopant concentration within the single seed layer can be constant. Variability of the (segregated) dopant concentration within an interconnect structure is achieved by locally varying the surface area of the line bottom where the single seed layer is formed.

By varying the line bottom surface area, the ratio of the line bottom area to the corresponding area at the line top can be controlled, and hence the relative amount of dopant available to segregate to the interface with the dielectric capping layer 160 at the line top can be controlled. In various embodiments, the line bottom surface area within discrete regions of the interconnect structure can be equal to or greater than a corresponding line top area, i.e., the interfacial area between the bulk copper layer 150 and the dielectric capping layer 160.

In one approach to increase the line bottom area, the planarity of the trench bottom is interrupted by the incorporation of dummy vias into the trench bottoms. Although the dummy vias do not provide an electrical connection, they increase both the copper density within the interconnect structure and the dopant density for a given seed layer thickness.

Figure 3A:
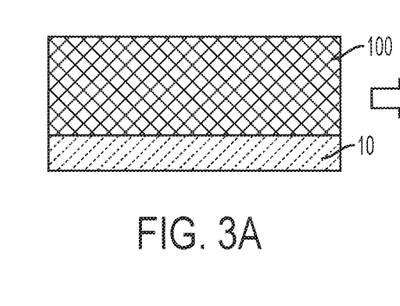
FIGS. 3A-3F are cross-sectional views illustrating the formation an interconnect architecture having different dopant concentrations within different conductive lines at the same wiring level according to one embodiment by the creation of interconnect trenches having a variable line bottom area.
Figure 3B:
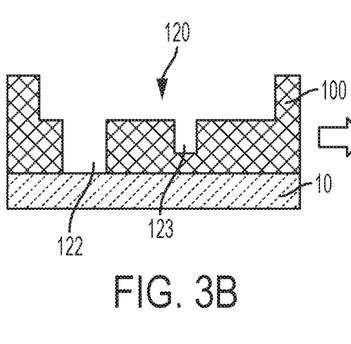
Figure 3C:
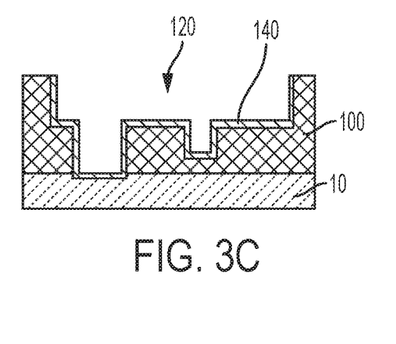

With reference to FIG. 3A, dielectric layer 100 is disposed over semiconductor substrate 10. As shown in FIG. 3B, trench 120 is etched into dielectric layer 100 by conventional patterning and etching techniques. Trench 120 may be formed by wet etching, drying etching, or a combination thereof. In various embodiments, an etching process is selected that etches smaller features at a slower rate than larger features. By way of example, a single step etching process can etch wider contact aperture openings 122 more rapidly than narrower dummy aperture openings 123 due to micro loading effects or a RIE lag phenomenon, which is caused by the depletion of etching ions and radicals during their trench passage.

Thus, trench 120 includes a contact aperture 122 that extends through the dielectric layer 100 to a top surface of the semiconductor substrate 10 and a dummy aperture 123 that does not extend through the dielectric layer to the semiconductor substrate 10.

Figure 3D:
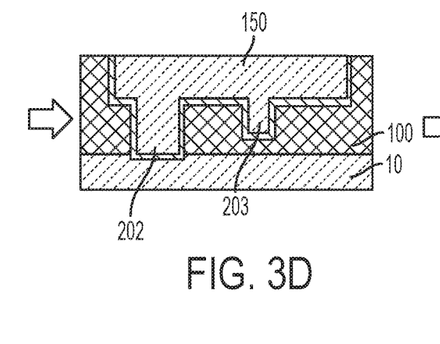

An optional barrier layer (not shown) and a doped seed layer 140 are formed over exposed surfaces within the trench 120, including exposed surfaces of the substrate 10 and the dielectric layer 110, i.e., within the contact aperture 122 and the dummy aperture 123. With reference to FIG. 3D, a bulk copper layer 150 that includes a contact via 202 and a dummy via 203 is electroplated over the seed layer 140 and planarized. The dummy via 203 serves as a spatially-localized reservoir that harbors additional dopant.

Figure 3E:
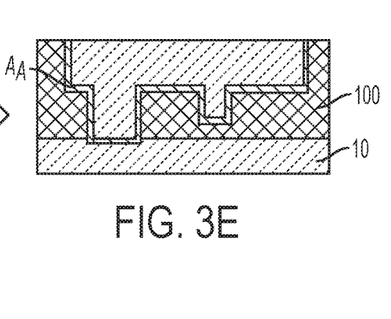
Figure 3F:
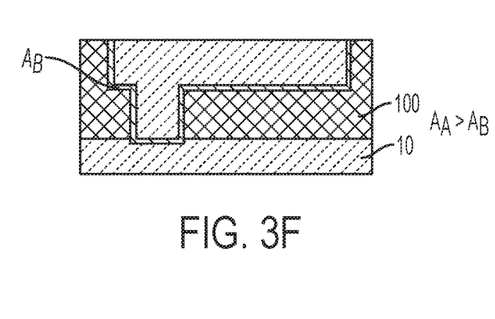

The line bottom area for the structure that includes a dummy via is $A_A$ (FIG. 3E). The line bottom area for a comparable structure not including a dummy via is $A_B$ (FIG. 3F), where $A_A > A_B$. Accordingly, for the same seed layer thickness and composition, the amount of dopant available to segregate to the top interface is greater for the structure that includes the dummy vias 203.

One or more dummy vias 203 may be incorporated into an interconnect structure. The dummy vias may have a length or width, e.g., diameter, of 0.5 to 4 microns and spacing of 5 to 50 microns, although other dimensions are contemplated. Dummy vias 203 have a depth that extends into the dielectric layer 100 from a bottom surface of the trench 120. In various embodiments, a plurality of dummy vias 203 can be independently formed to a depth of 1% to 75% of the starting thickness of the dielectric layer 100. Dummy vias may be incorporated in a regular or irregular pattern throughout a given trench. In several embodiments, dummy vias are located proximate to one or both ends of a trench.

For instance, in various embodiments, dummy vias are located proximate to one or both ends of a trench, i.e., at the end(s) of the line. Dummy vias located proximate to an end of a conductive line are located within a distance of 1 micron from the end of the line. In such embodiments, dummy vias may be omitted or incorporated to a lesser extent away from the line ends.

After deposition of a capping layer (not shown) and the associated dopant segregation, first and second interconnect structures can be formed at the same wiring level having different dopant concentrations, i.e., metal alloy layers 170 of different final thickness.

In various embodiments, a ratio of the line bottom area to the projected area at the top of the same line can range from 1 to 50, e.g., 1, 2, 5, 10, 20, 40 or 50, including ranges between any of the foregoing values.

In a further approach to increase the line bottom area, microtrenches are incorporated into the trench bottoms. As with the dummy vias, microtrenches create a non-planar trench bottom surface and do not provide an electrical connection, but increase the copper density as well as the dopant density within the interconnect structure for a given seed layer thickness.

According to various embodiments, microtrenches can be formed by double patterning. Double patterning (DP) is a litho-etch-litho-etch (LELE) process, which is an attractive technique for producing high resolution, nanometer scale features. With double patterning, successive patterning and etching steps at least partially overlap to create a microtrench-containing trench template in a hard mask layer that can be transferred into a dielectric layer.

A method of forming microtrenches to increase the trench bottom area within an interlayer dielectric (ILD) layer is illustrated in FIGS. 4A-4I.

Figure 4A:
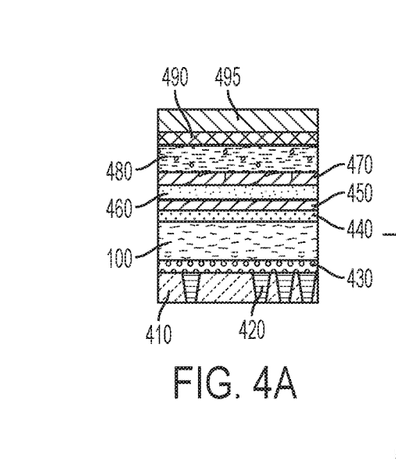
FIGS. 4A-4I illustrate the formation of an interconnect architecture having different dopant concentrations within different conductive lines at the same wiring level according to a further embodiment through the creation of microtrenches to locally increase the line bottom area within interconnect trenches.

The structure in FIG. 4A includes a dielectric layer 410 having embedded therein conductive interconnects 420, which may be conductive vias or lines. Conductive interconnects 420 may include copper. Formed directly over the surface of the dielectric layer 410 and conductive interconnects 420 is a dielectric capping layer 430. The dielectric capping layer 430 inhibits diffusion of metals including copper.

The dielectric capping layer 430 may comprise a nitride compound such as nitrogen-doped silicon carbide (SiCN). Other suitable dielectric capping layer compositions include $Si_3N_4$, $SiO_2$, SiC, and hydrogen-doped silicon carbide.

Example silicon carbide-based materials (e.g., $SiC_xN_yH_z$) deposited using chemical vapor deposition (CVD) from a trimethylsilane source may be used to form the dielectric capping layer 430. Such silicon carbide-based capping layer materials may include up to 25 mol. % nitrogen, e.g., 1, 2, 5, 10, 15, 20 or 25 mol. % nitrogen, including ranges between any of the foregoing values. Suitable $SiC_xN_yH_z$ compounds having less than 5 mol. % nitrogen typically have a dielectric constant of less than 4, and are effective copper barriers. Example $SiC_xN_yH_z$ compounds having 10 to 25 mol. % nitrogen typically have a dielectric constant of about 5, and are effective barrier materials to both copper and oxygen. In various embodiments, the dielectric capping layer 430 has a dielectric constant less than that of silicon nitride.

Disposed over the dielectric capping layer 430 is an interlayer dielectric 100 within which the interconnect structures will be formed. A typical interlayer dielectric 100 comprises silicon oxide and has a thickness of 200 to 1000 nm.

A hard mask 440 is disposed over the interlayer dielectric 100. Example hard mask materials include silicon nitride, silicon oxynitride, and porous carbon-doped thin films formed using octamethylcyclotetrasiloxane (OMCTS, $C_8H_{24}O_4Si_4$) and oxygen.

Additional masking layers are disposed over the hard mask 440, and include a first tetraethylorthosilicate (TEOS)-derived layer 450, a TiN layer 460, and a second TEOS layer 470. Masking layers 440, 450, 460 and 470 may be formed using plasma enhanced chemical vapor deposition (PECVD).

Disposed over the second TEOS layer 470 is an organic planarization layer (OPL) 480. The OPL 480 typically includes a photo-sensitive organic polymer comprising a light-sensitive material that when exposed to electromagnetic radiation is chemically altered and thereby configured to be removed using a developing solvent. Example photo-sensitive organic polymers include polyacrylate resins, epoxy resins, phenol resins, polyamide resins, polyimide resins, unsaturated polyester resins, polyphenylenether resins, and polyphenylenesulfide resins.

More generally, the developable OPL 480 may comprise any organic polymer and a photo-active compound having a molecular structure that can attach to the molecular structure of the organic polymer. Furthermore, the developable OPL 480 is selected to be compatible with the overlying developable anti-reflection coating (ARC) layer 490, and the overlying photo-resist (PR) layer 495, as well as the processing wavelength of the photolithography system. The developable OPL 480 may be applied by spin coating.

The anti-reflection coating (ARC) 490 comprises a light-sensitive material that when exposed to electromagnetic radiation is chemically altered and thereby configured to be removed using a developing solvent. The ARC 490 absorbs light that passes through the photoresist 495 to reduce interfering reflections, which improves the fidelity of the projected image.

The tri-layer mask stack consisting of a layer of photo-resist 495, a silicon-containing anti-reflective coating (SiARC) 490, and an organic planarization underlayer (OPL) 480 may be used to enable immersion lithography with the high numerical aperture lens while minimizing reflectivity.

The tri-layer mask may be provided for patterning the oxide/nitride stacked layers 450, 460, 470 to form a conductive line embedded within dielectric layer 100. The tri-layer mask stack defines a pattern for the immersion lithography by patterning each of the lithographic-aiding layers.

Figure 4B:
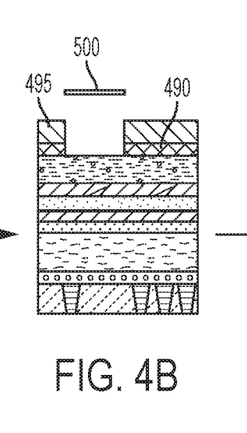

Initially, using a suitable mask 500 such as a bright field mask, a first pattern is defined in the photoresist layer 495 of the tri-layer mask using, for example, reactive ion etching (RIE). Then, as shown in FIG. 4B, the first pattern is defined in the SiARC layer 490.

Figures 4C, 4D:
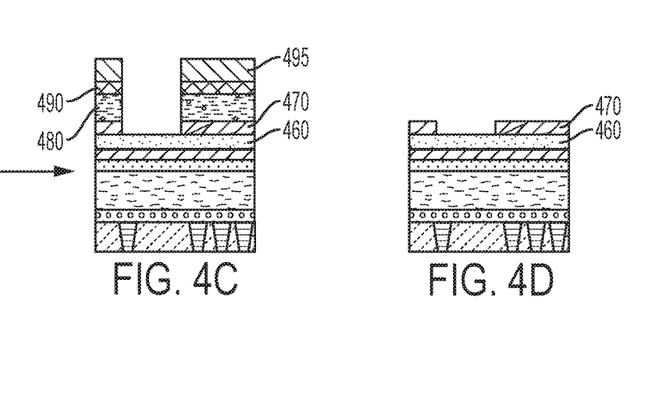

In FIG. 4C, the tri-layer mask is completed by defining the first pattern in the OPL 480. Referring to FIG. 4D, the first pattern has been defined in the second TEOS layer 470, and the photoresist layer 495, SiARC layer 490 and the OPL 480 have been removed. During etching of the second TEOS layer 470, the TiN layer 460 may serve as an etch stop.

Figure 4E:
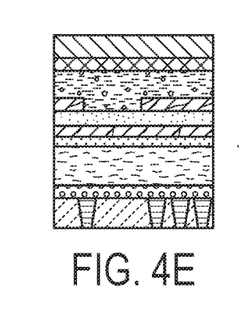

As shown with reference to FIG. 4E, a new tri-layer mask stack consisting of a layer of photoresist 495, a silicon-containing anti-reflective coating (SiARC) 490, and an organic planarization under layer (OPL) 480 is provided over the intermediate structure of FIG. 4D.

Figure 4F:
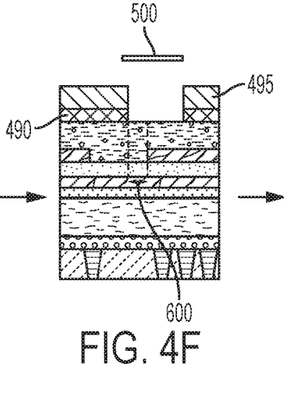

Referring to FIG. 4F, using mask 500, a second pattern is defined in the photoresist layer 495 and SiARC layer 490 of the tri-layer mask. The second pattern partially overlaps the first pattern within overstitching region 600.

Figures 4G, 4H:
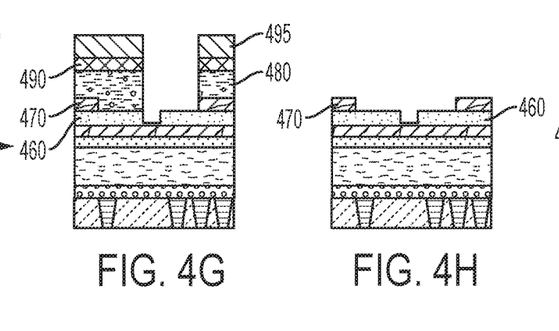

Then referring to FIG. 4G, the tri-layer mask is completed by defining the second pattern in the OPL 480. Continuation of the etching defines the second pattern in the second TEOS layer 470, and includes over-etching of the TiN layer 460 within the overstitching region 600 whereby the amount of removal of the TiN layer 460 within the overstitching region is greater than the amount of removal of the TiN layer 460 outside of the overstitching region.

Referring to FIG. 4H, the second pattern has been defined in the second TEOS layer 470, and the photoresist layer 495, SiARC layer 490 and the OPL 480 have been removed. The patterned second TEOS layer defines the geometry of a trench, while the patterned TiN hard mask 460 defines the geometry of a microtrench that will be formed in a bottom surface of the trench.

Figure 4I:
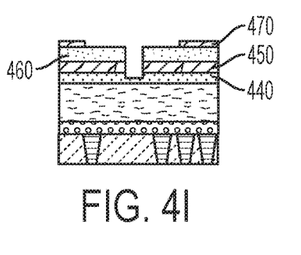

As can be seen with reference to FIG. 4I, using an etch chemistry that removes the TiN layer 460 and that etches silicon oxide, the pattern within the TiN layer 460 is transferred into the first TEOS layer 460. Through one or more additional etching steps, the pattern is further transferred into the dielectric layer 100 to form a trench 120 in the dielectric layer 100 having a microtrench 204 disposed in a bottom surface thereof. In the instant embodiment, a first litho-etch (LE) cycle is illustrated with reference to FIGS. 4A-4D and a second litho-etch (LE) cycle is illustrated with reference to FIGS. 4E-4I.

Figure 5A:
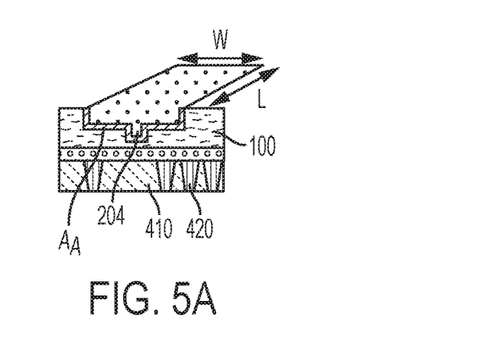
FIGS. 5A and 5B are perspective views of interconnect architectures showing the presence and absence of microtrenches within interconnect trenches.

As seen in the perspective view of FIG. 5A, trench 120 includes a microtrench 204 that runs parallel to the length of the trench. Trench 120, including microtrench 204, can be seeded and then backfilled with copper to form an interconnect structure.

Figure 5B:
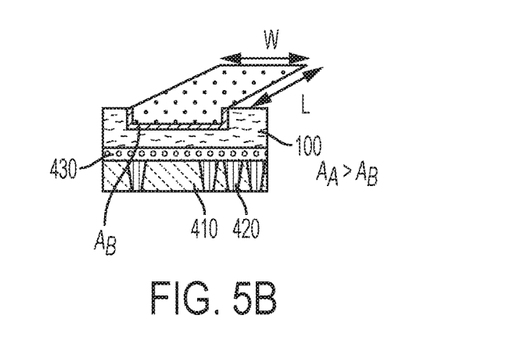

The line bottom area for the structure of FIG. 5A, which includes microtrench 204 is $A_A$, whereas the line bottom area for a comparable structure not including a microtrench is $A_B$, where $A_A > A_B$ (FIG. 5B). Accordingly, for the same seed layer thickness and composition, the amount of dopant within the seed layer that is available to segregate to the top interface is greater for the structure that includes the microtrench. It will be appreciated that a trench 120 may include one or more microtrenches, which increase the line bottom area.

In the example of a 1 micron wide trench having a length L and comprising an array of 19 parallel microtrenches each measuring 50 nm wide×50 nm deep formed in a bottom surface thereof, the trench bottom area $A_B = L \times [1000 + (2)(50)(19)]$ nm² $= 2900L$ nm². By comparison, the same trench without the microtrenches has a trench bottom area $A_A = 1000L$ nm². Thus, by incorporating microtrenches into a trench bottom surface, the trench bottom area is increased by a factor of 2.9.

Example microtrenches have a width and a depth that range independently from 10 to 500 nm, e.g., 10, 20, 50, 100, 200 or 500 nm, and a spacing of 10 to 500 nm, e.g., 10, 20, 50, 100, 200 or 500 nm, including ranges between any of the foregoing.

In several embodiments, microtrenches are located proximate to one or both ends of a trench, i.e., at the end(s) of the line. Microtrenches located proximate to an end of a conductive line are located within a distance of 1 micron from the end of the line. In such embodiments, microtrenches may be omitted or incorporated to a lesser extent away from the line ends.

An example interconnect has a first end separated from a second end by an intermediate portion, where the dopant concentration at the first and second ends is greater than the dopant concentration within the intermediate portion.

The disclosed Cu—Mn electrode deposition process, which includes deposition and patterning approaches for locally varying the amount of dopant that is incorporated into a conductive line at a given wiring level, has the potential to enable a robust integration approach for metallizing interconnects in future-generation technology nodes.

As used herein, the singular forms "a," "an" and "the" include plural referents unless the context clearly dictates otherwise. Thus, for example, reference to a "dopant" includes examples having two or more such "dopants" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to an interconnect structure that comprises a copper alloy include embodiments where an interconnect structure consists essentially of a copper alloy and embodiments where an interconnect structure consists of a copper alloy.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed as new is:

1. An integrated circuit comprising:
   a first interconnect and a second interconnect at the same wiring level over a semiconductor substrate; and
   a dielectric capping layer over a top surface of the first and second interconnect structures, wherein the first interconnect comprises a first bulk metal layer having a first dopant concentration and the second interconnect comprises a second bulk metal layer having a second dopant concentration different from the first dopant concentration.

2. The integrated circuit according to claim 1, further comprising a dielectric layer over the semiconductor substrate, wherein the first interconnect is disposed within a first trench in the dielectric layer and the second interconnect is disposed within a second trench in the dielectric layer.

3. The integrated circuit according to claim 2, wherein the first interconnect is disposed within a structure selected from the group consisting of a dummy via and a microtrench located in a bottom surface of the trench.

4. The integrated circuit according to claim 3, wherein the structure comprises a plurality of parallel microtrenches.

5. The integrated circuit according to claim 3, wherein the first dopant concentration is greater than the second dopant concentration.

6. The integrated circuit according to claim 1, wherein the first interconnect has a first end portion separated from a second end portion by an intermediate portion and a dopant concentration within the first end portion is different than a dopant concentration within the second end portion.

7. The integrated circuit according to claim 1, wherein the first interconnect has a first end portion separated from a second end portion by an intermediate portion and a dopant concentration within each of the first and second end portions is different than a dopant concentration within the intermediate portion.

8. The integrated circuit according to claim 1, comprising a first metal alloy layer between the dielectric capping layer and the bulk metal layer of the first interconnect, and a second metal alloy layer between the dielectric capping layer and the bulk metal layer of the second interconnect, wherein the first metal alloy layer is thicker than the second metal alloy layer.

9. The integrated circuit according to claim 8, wherein the first and second metal alloy layers comprise a reaction product of the dielectric capping layer and a dopant.

10. The integrated circuit according to claim 9, wherein the first and second metal alloy layers each comprise copper and manganese.

11. The integrated circuit according to claim 1, wherein the first interconnect is a power interconnect and comprises a first alloy of copper and manganese, and the second interconnect is a signal interconnect and comprises a second alloy of copper and manganese, wherein the first alloy has a concentration of manganese greater than the second alloy.

12. A method of forming an integrated circuit, comprising:
    forming a first interconnect and a second interconnect within respective first and second trenches at a same wiring level;
    forming a first seed layer within the first trench and a second seed layer within the second trench, the first seed layer having a different dopant concentration than the second seed layer;
    forming a structure selected from the group consisting of a dummy via and a microtrench within a bottom surface of at least one of the first trench and the second trench prior to forming the first and second seed layers;
    forming a first dopant concentration within the first interconnect; and
    forming a second dopant concentration within the second interconnect different from the first dopant concentration.

13. The method according to claim 12, wherein forming the structure comprises forming a plurality of parallel microtrenches.

* * * * *